(12) United States Patent
Kim et al.

(10) Patent No.: US 7,910,489 B2
(45) Date of Patent: Mar. 22, 2011

(54) INFINITELY SELECTIVE PHOTORESIST MASK ETCH

(75) Inventors: Ji Soo Kim, Pleasanton, CA (US); Peter Cirigliano, Sunnyvale, CA (US); Sangheon Lee, Sunnyvale, CA (US); Dongho Heo, Fremont, CA (US); Daehan Choi, Sunnyvale, CA (US); S. M. Reza Sadjadi, Saratoga, CA (US)

(73) Assignee: Lam Research Corporation, Fremont, CA (US)

(*) Notice: Subject to any disclaimer, the term of this patent is extended or adjusted under 35 U.S.C. 154(b) by 914 days.

(21) Appl. No.: 11/357,548

(22) Filed: Feb. 17, 2006

(65) Prior Publication Data

US 2007/0193973 A1    Aug. 23, 2007

(51) Int. Cl.
*H01L 21/302* (2006.01)

(52) U.S. Cl. .......... 438/717; 438/714; 438/723; 134/1.1

(58) Field of Classification Search .................. 438/706, 438/710, 712, 714, 720, 723, 717; 134/1.1, 134/1.2
See application file for complete search history.

(56) References Cited

U.S. PATENT DOCUMENTS

| | | | |
|---|---|---|---|
| 4,414,059 A | 11/1983 | Blum et al. | |
| 4,795,529 A | 1/1989 | Kawasaki et al. | |
| 4,985,114 A | 1/1991 | Okudaira et al. | |
| 5,401,359 A * | 3/1995 | Kadomura | 438/16 |
| 5,468,342 A * | 11/1995 | Nulty et al. | 438/714 |
| 5,468,686 A | 11/1995 | Kawamoto | |
| 5,498,312 A | 3/1996 | Laermer et al. | |
| 5,501,893 A | 3/1996 | Laermer et al. | |
| 5,545,289 A | 8/1996 | Chen et al. | |
| 5,562,801 A | 10/1996 | Nulty | |
| 5,882,535 A | 3/1999 | Stocks et al. | |
| 5,942,446 A | 8/1999 | Chen et al. | |
| 6,025,255 A | 2/2000 | Chen et al. | |
| 6,046,115 A | 4/2000 | Molloy et al. | |
| 6,051,503 A | 4/2000 | Bhardwaj et al. | |
| 6,071,822 A | 6/2000 | Donohue et al. | |
| 6,074,959 A | 6/2000 | Wang et al. | |
| 6,100,200 A | 8/2000 | Van Buskirk et al. | |
| 6,127,258 A | 10/2000 | Watanabe et al. | |
| 6,127,273 A | 10/2000 | Laermer et al. | |
| 6,187,666 B1 | 2/2001 | Singh et al. | |
| 6,187,685 B1 | 2/2001 | Hopkins et al. | |
| 6,200,822 B1 | 3/2001 | Becker et al. | |

(Continued)

FOREIGN PATENT DOCUMENTS

CN    1241812 A    1/2000

(Continued)

OTHER PUBLICATIONS

International Search Report dated Jun. 11, 2007 for corresponding International Application No. PCT/US2007/002511.

(Continued)

*Primary Examiner* — Lan Vinh
(74) *Attorney, Agent, or Firm* — Beyer Law Group LLP (57) ABSTRACT

A method for etching features into an etch layer disposed below a photoresist mask without an intermediate hardmask is provided. A plurality of etch cycles are provided. Each etch cycle comprises providing a deposition etch phase that etches features into the etch layer and deposits polymer on sidewalls of the features and over the photoresist and providing a cleaning phase that removes polymer deposited on the sidewalls.

10 Claims, 6 Drawing Sheets

U.S. PATENT DOCUMENTS

| | | | |
|---|---|---|---|
| 6,211,092 B1 | 4/2001 | Tang et al. | |
| 6,214,161 B1 | 4/2001 | Becker et al. | |
| 6,261,962 B1 | 7/2001 | Bhardwaj et al. | |
| 6,284,148 B1 | 9/2001 | Laermer et al. | |
| 6,284,666 B1 | 9/2001 | Naeem et al. | |
| 6,291,357 B1 | 9/2001 | Zhang et al. | |
| 6,303,512 B1 | 10/2001 | Laermer et al. | |
| 6,316,169 B1 | 11/2001 | Vahedi et al. | |
| 6,326,307 B1 | 12/2001 | Lindley et al. | |
| 6,376,382 B1 * | 4/2002 | Chiou et al. | 438/696 |
| 6,387,287 B1 | 5/2002 | Hung et al. | |
| 6,403,491 B1 | 6/2002 | Liu et al. | |
| 6,406,995 B1 | 6/2002 | Hussein et al. | |
| 6,444,568 B1 | 9/2002 | Sundararajan et al. | |
| 6,488,862 B1 | 12/2002 | Ye et al. | |
| 6,489,632 B1 | 12/2002 | Yamazaki et al. | |
| 6,500,743 B1 | 12/2002 | Lopatin et al. | |
| 6,518,192 B2 | 2/2003 | Khan et al. | |
| 6,537,906 B1 | 3/2003 | Mori | |
| 6,569,774 B1 | 5/2003 | Trapp | |
| 6,617,253 B1 | 9/2003 | Chu et al. | |
| 6,632,903 B2 | 10/2003 | Jung et al. | |
| 6,647,994 B1 | 11/2003 | Lui et al. | |
| 6,833,325 B2 | 12/2004 | Huang et al. | |
| 6,846,516 B2 | 1/2005 | Yang et al. | |
| 6,916,746 B1 | 7/2005 | Hudson et al. | |
| 2001/0012694 A1 * | 8/2001 | Coburn et al. | 438/689 |
| 2002/0179570 A1 * | 12/2002 | Mathad et al. | 216/67 |
| 2003/0027427 A1 | 2/2003 | Ma et al. | |
| 2003/0162395 A1 * | 8/2003 | Trapp | 438/689 |
| 2003/0189024 A1 | 10/2003 | Khan et al. | |
| 2004/0221797 A1 | 11/2004 | Mosden et al. | |
| 2005/0037624 A1 | 2/2005 | Huang et al. | |
| 2005/0048789 A1 * | 3/2005 | Merry et al. | 438/723 |
| 2005/0136682 A1 | 6/2005 | Hudson et al. | |
| 2005/0266682 A1 | 12/2005 | Chen et al. | |

FOREIGN PATENT DOCUMENTS

| | | |
|---|---|---|
| DE | 10059836 A1 | 6/2002 |
| EP | 0 268 021 A2 | 5/1988 |
| EP | 0 363 982 A2 | 4/1990 |
| EP | 0 822 582 A2 | 2/1998 |
| JP | S63-13334 | 1/1988 |
| JP | 04-240729 A | 8/1992 |
| JP | 07226397 | 8/1995 |
| JP | 09036089 | 2/1997 |
| JP | 2001068462 | 3/2001 |
| TW | 505984 | 10/2002 |
| TW | 538476 | 6/2003 |
| WO | WO 00/05749 | 2/2000 |
| WO | WO 00/30168 | 5/2000 |
| WO | WO 01/04707 A1 | 1/2001 |
| WO | WO 01/04707 A1 | 1/2001 |
| WO | WO 01/29879 A2 | 4/2001 |
| WO | WO 01/29879 A3 | 4/2001 |
| WO | 2004/034445 A2 | 4/2004 |

OTHER PUBLICATIONS

Written Opinion dated Jun. 11, 2007 for corresponding International Application No. PCT/US2007/002511.

International Search Report, dated Feb. 24, 2004.
International Search Report, dated Sep. 10, 2004.
International Search Report, dated Oct. 7, 2005.
Office Action mailed Jun. 23, 2005 for U.S. Appl. No. 10/674,675.
Office Action mailed Nov. 15, 2005 for U.S. Appl. No. 10/674,675.
Office Action mailed Apr. 12, 2006 for U.S. Appl. No. 10/674,675.
Office Action mailed May 11, 2006 for U.S. Appl. No. 10/860,833.
U.S. Appl. No. 10/674,675, filed Sep. 29, 2003.
U.S. Appl. No. 10/860,833, file Jun. 3, 2004.
U.S. Appl. No. 10/946,181, file Sep. 20, 2004.
U.S. Appl. No. 11/055,878, file Feb. 11, 2005.
Eto et al., "High Selectivity Photoresist Ashing by the Addition of $NH_3$ to $CF_4/O_2$ or $CHF_3/O_2$", SID 99 Digest, pp. 844-847.
Office Action mailed Jan. 12, 2007, U.S. Appl. No. 10/946,181.
Notice of Allowance dated Aug. 13, 2007 for U.S. Appl. No. 10/860,833.
Notice of Allowance dated Oct. 12, 2006 from U.S. Appl. No. 10/674,675.
Office Action dated Jun. 22, 2007 for U.S. Appl. No. 11/055,878.
Final Office Action dated Sep. 20, 2007 for U.S. Appl. No. 11/055,878.
Office Action dated Apr. 10, 2008 for U.S. Appl. No. 11/055,878.
Office Action dated Oct. 17, 2006 for U.S. Appl. No. 10/860,833.
Office Action dated Apr. 4, 2007 for U.S. Appl. No. 10/860,833.
Australian Search Report dated Feb. 25, 2008 for Singapore Patent Application No. 200608124-4.
Written Opinion dated Feb. 25, 2008 for Singapore Patent Application No. 200608124-4.
Indian Office Action dated Jan. 31, 2008 from Indian Patent Application No. 2004/KOLNP/2005.
Office Action dated Nov. 4, 2008 from U.S. Appl. No. 11/055,878.
U.S. Office Action dated Mar. 20, 2009 from U.S. Appl. No. 11/055,878.
Israeli Official Action dated May 3, 2009 from Israeli Patent Application No. 171270.
Taiwan Office Action dated Mar. 31, 2009 from Taiwan Patent Application No. 92128179.
European Examination Report dated Jul. 13, 2009 from European Patent Application No. 05760834.1.
Final Office Action dated Sep. 11, 2009 from U.S. Appl. No. 11/055,878.
Examination Report dated Sep. 16, 2009 from European Application No. 03 774 602.1.
Search Report dated Nov. 12, 2009 from Singapore Patent Application No. 200705771-4.
Written Opinion dated Nov. 12, 2009 from Singapore Patent Application No. 200705771-4.
Office Action dated Feb. 2, 2010 from Japanese Application No. 2006-509625.
Office Action dated Apr. 14, 2010 from Chinese Patent Application No. 200380105311.4.
Office Action dated Jul. 2, 2010 from U.S. Appl. No. 11/508,725.
Supplementary Search Report dated Sep. 10, 2010 from European Patent Application No. 04759091.4.
Office Action and Search Report dated Oct. 25, 2010 from Taiwan Patent Application No. 093109498.

* cited by examiner

INFINITELY SELECTIVE PHOTORESIST MASK ETCH

BACKGROUND OF THE INVENTION

The invention relates to the formation of semiconductor devices. More specifically, the invention relates to the formation of semiconductor devices by etching features in an etch layer.

During semiconductor wafer processing, features of the semiconductor device are defined in the wafer using well-known patterning and etching processes. In these processes, a photoresist (PR) material is deposited on the wafer and then is exposed to light filtered by a reticle. The reticle may be a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

In semiconductor-based device (e.g., integrated circuits or flat panel displays) manufacturing, dual damascene structures may be used in conjunction with copper conductor material to reduce the RC delays associated with signal propagation in aluminum-based materials used in previous generation technologies. In dual damascene, instead of etching the conductor material, vias and trenches may be etched into the dielectric material and filled with copper.

Generally, during the etching of the underlying material some of the photoresist material is removed. The ratio of the amount of underlying material that is etched with respect to the photoresist that is etched is used to determine etch selectivity.

SUMMARY OF THE INVENTION

To achieve the foregoing and in accordance with the purpose of the present invention, a method for etching features into an etch layer disposed below a photoresist mask without an intermediate hardmask is provided. A plurality of etch cycles are provided. Each etch cycle comprises providing a deposition etch phase that etches features into the etch layer and deposits polymer on sidewalls of the features and over the photoresist and providing a cleaning phase that removes polymer deposited on the sidewalls.

In another manifestation of the invention, a method for etching features into an etch layer disposed below a photoresist mask without an intermediate hardmask is provided. A 15 to 50 etch cycle etch with infinite selectively is provided. Each etch cycle comprises providing a deposition etch phase that etches features into the etch layer and deposits polymer on sidewalls of the features and over the photoresist and providing a cleaning phase that removes polymer deposited on the sidewalls.

In another manifestation of the invention, an apparatus for forming features in an etch layer, wherein the etch layer is supported by a substrate and wherein the etch layer is covered by a photoresist mask without an intermediate hardmask, is provided. A plasma processing chamber is provided with a chamber wall forming a plasma processing chamber enclosure. A substrate support supports a substrate within the plasma processing chamber enclosure. A pressure regulator regulates the pressure in the plasma processing chamber enclosure. At least one electrode provides power to the plasma processing chamber enclosure for sustaining a plasma. A gas inlet provides gas into the plasma processing chamber enclosure. A gas outlet exhausts gas from the plasma processing chamber enclosure. A gas source is in fluid connection with the gas inlet and comprises an etch gas source, a deposition gas source, and a cleaning phase gas source. A controller controllably is connected to the gas source and the at least one electrode. The controller comprises at least one processor and computer readable media. The computer readable media comprises computer readable code for providing 15 to 50 etch cycles, which comprises computer readable code for providing a deposition etch phase that etches features into the etch layer and deposits polymer on sidewalls of the features and over the photoresist, which comprises computer readable code for providing an etch gas from the etch gas source, computer readable code for generating a plasma from the etch gas, computer readable code for providing a deposition gas from the deposition gas source, computer readable code for generating a plasma from the deposition gas, and computer readable code for stopping the deposition and etch phase and computer readable code for providing a cleaning phase that removes polymer deposited on the sidewalls, which comprises computer readable code for providing a cleaning phase gas from the cleaning phase gas source, computer readable code for generating a plasma from the cleaning phase gas, and computer readable code for stopping the cleaning phase.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
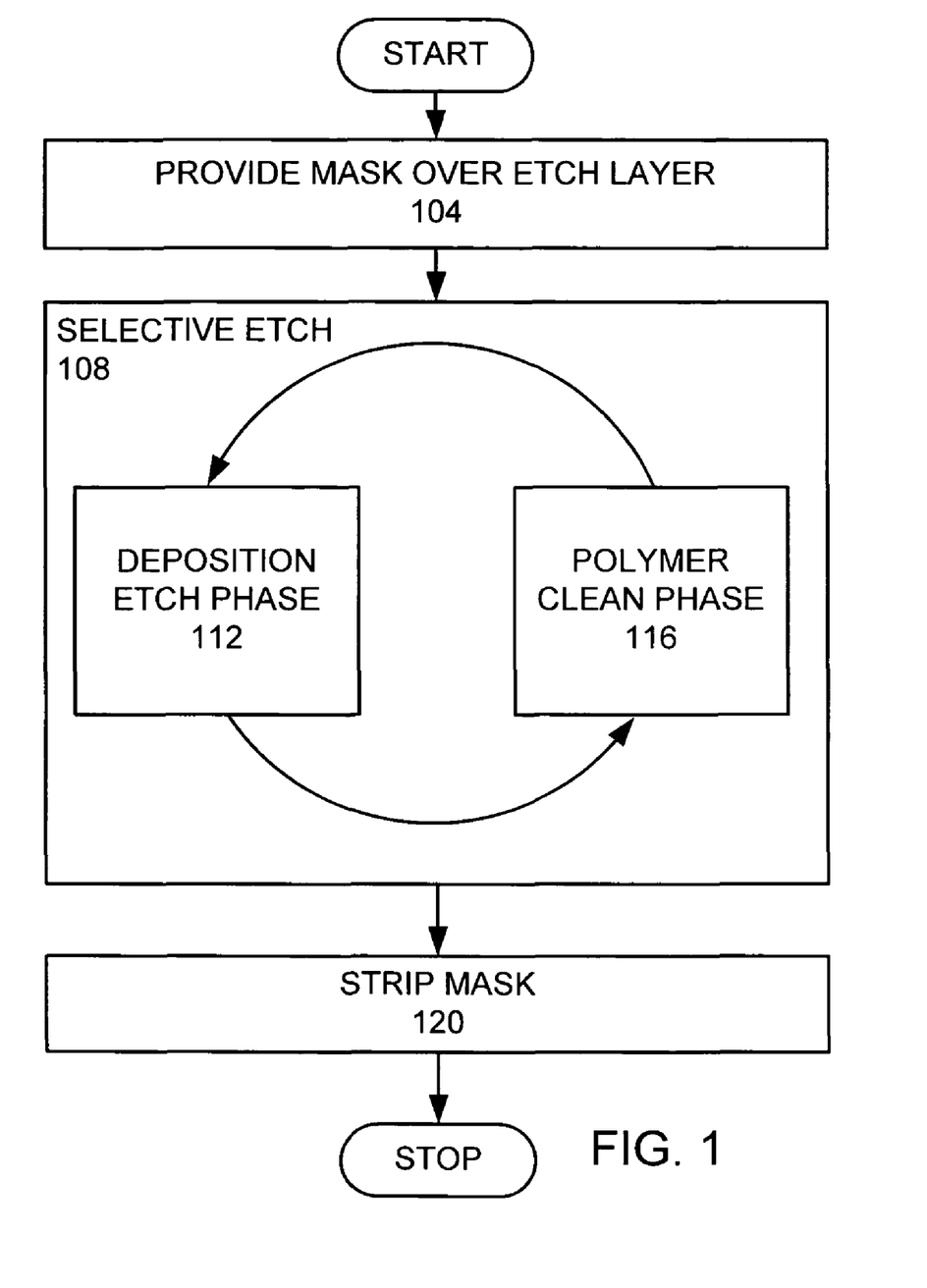
FIG. 1 is a high level flow chart of the formation of features in an etch layer used in an embodiment of the invention.
Figure 2A:
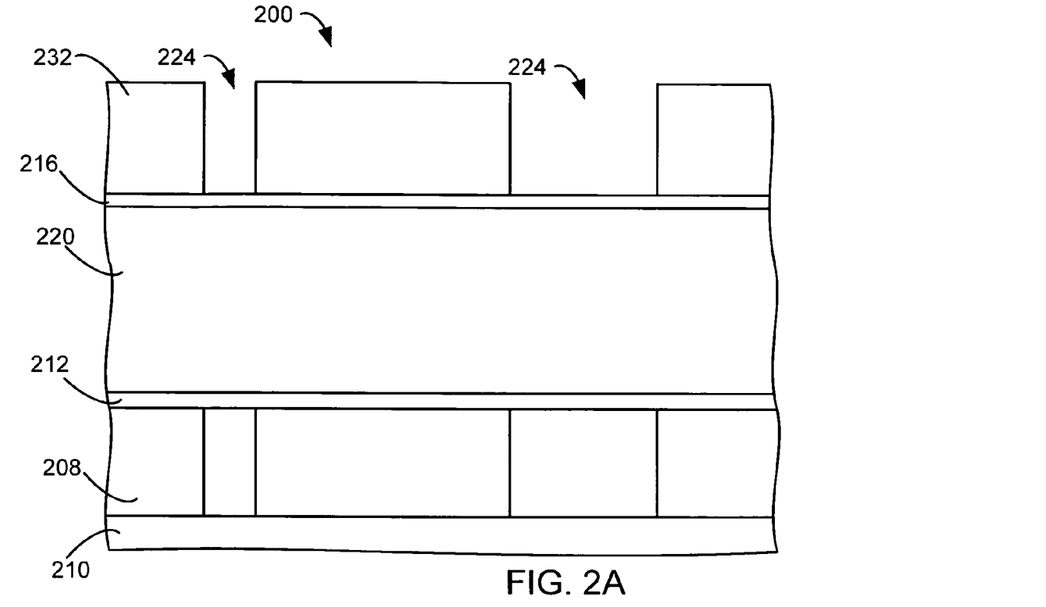
FIGS. 2A-D are schematic views of the formation of features according to the embodiment shown in FIG. 1.

To facilitate understanding, FIG. 1 is a high level flow chart of a process used in an embodiment of the invention. A via mask is provided over an etch layer (step 104). FIG. 2A is a cross-sectional view of a stack 200 with an etch layer 220 formed over a barrier layer 212, which are formed over a wafer 210. In this example, a layer 208 is disposed between the barrier layer 212 and the wafer 210. Although the layer 208 is shown as being formed on the wafer 210, there may be any number of layers formed between the etch layer 220 and the wafer 210. In this example, the barrier layer 212 may be a silicon carbide (SiC) layer or it may also be SiN. The etch layer 220 may be a low-k dielectric, such as organosilicate dielectrics and porous dielectric, including CORAL™ from Novellus of San Jose, Calif.; Black Diamond™ from Applied Materials of Santa Clara, Calif.; Aurora™ available from ASM International N.V., The Netherlands; Sumika Film® available from Sumitomo Chemical America, Inc., Santa Clara, Calif.; HOSP™ from Allied Signal of Morristown, N.J.; SiLK™ or advanced porous SiLK from DOW Chemical Company; Orion® Flowfill™ from Trikon; and LKD™ from JSR Corp.

The formation of the via pattern may be performed by forming an anti-reflective layer (ARL) 216 over the etch layer 220. The ARL 216 may be formed by spin-on deposition.

A photoresist mask 232 is formed over the ARL 216 (step 104). The photoresist mask may be patterned by exposing a photoresist layer to a patterned light and then developing the photoresist layer 232 to obtain via apertures 224 in the photoresist layer.

Features are selectively etched into the etch layer 220 (step 108). The selective etch comprises a plurality of cycles, where each cycle comprises a deposition etch phase (step 112) and a polymer clean phase (step 116).

Figure 2B:
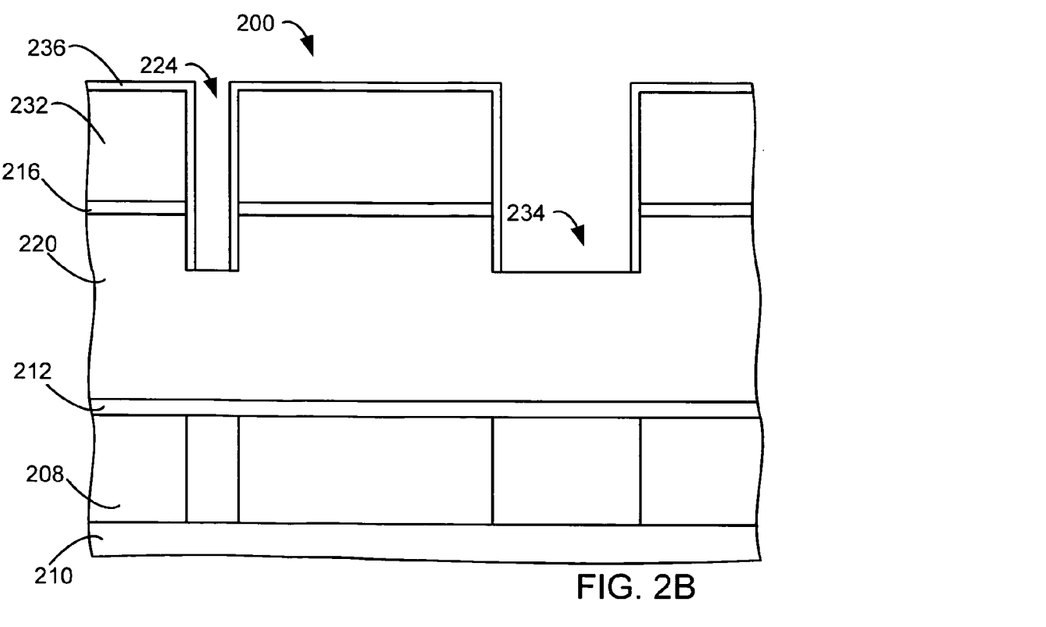

The deposition etch phase (step 112) selectively etches the etch layer 220 with respect to the photoresist mask 232 and deposits polymer on sidewalls of the feature and over the photoresist. FIG. 2B is a cross-sectional view of the stack 200 after a deposition etch phase (step 112). One or more etch cycles may have already been performed. The deposition etch phase etches part of the features 234, while depositing a polymer layer 236 over the sidewalls of the features 234 and over the photoresist mask 232. Such a deposition etch phase is preferably an infinite selectivity, since such a phase etches the etch layer 220 without etching the photoresist mask 232, but instead forming the polymer layer 236 over the photoresist mask 232.

Figure 2C:
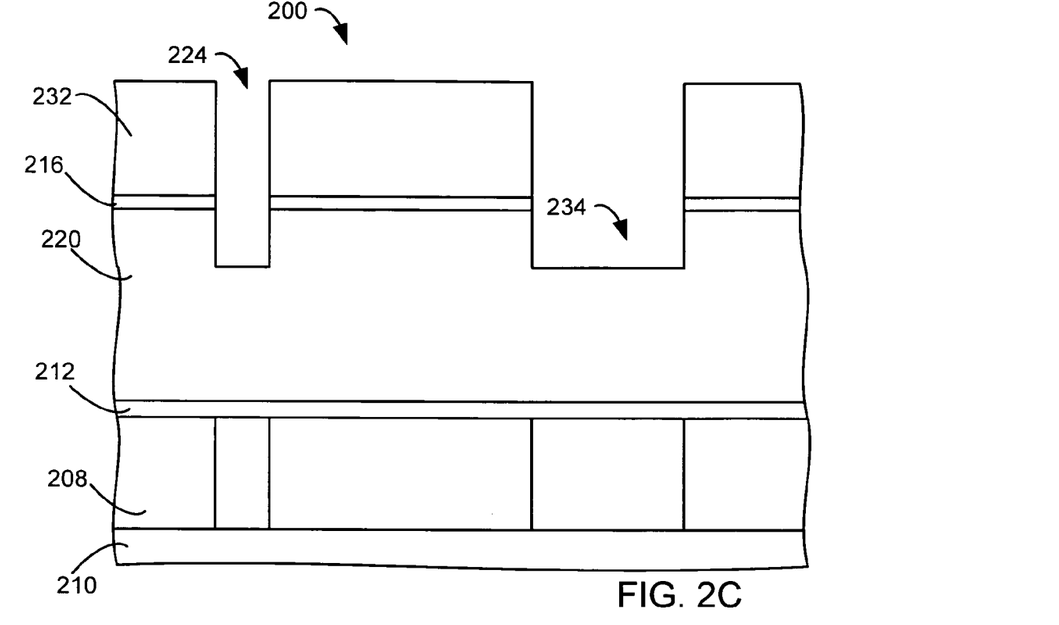

The polymer clean phase (step 116) removes the deposited polymer. FIG. 2C is a cross-sectional view of the stack 200 after a polymer clean phase. One or more etch cycles may have already been performed. The polymer clean phase removes the deposited polymer on the sidewalls of the feature. In the preferred embodiment, the etch layer is not etched during the polymer clean phase. In other embodiments, the polymer clean phase may etch the etch layer at the bottom of the features.

The etch cycle is preferably performed for 10 to 100 cycles. More preferably, the etch cycle is performed for 15 to 50 cycles. Most preferably, the etch cycle is performed for about 20 cycles.

Figure 2D:
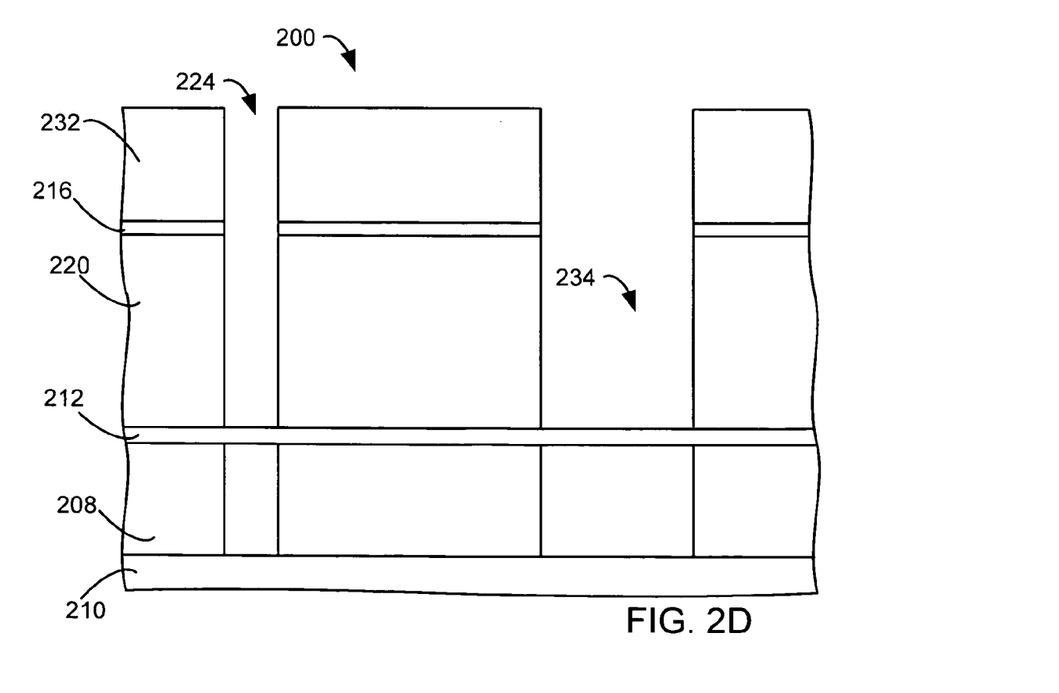

FIG. 2D is a cross-sectional view of the stack 200 after the selective etch (step 108) is completed. In this example, the features 234 are etched entirely through the etch layer 220. The photoresist mask 232 has not been etched, providing an infinite selectivity.

The photoresist mask 232 is then stripped (step 120).

Preferably, the sidewalls of the features 234 are vertical. Preferably, the vertical sidewalls are sidewalls that from bottom to top make an angle between 88° to 90° with the bottom of the features.

Preferably, the etch layer is a dielectric layer. More preferably, the etch layer is a low k dielectric layer. Most preferably, the dielectric layer is a low k silicon oxide based dielectric layer.

Without the polymer clean phase (step 116), a continuous deposition etch phase would continue to add more polymer on the sidewalls of the features. As a result, the widths of the features would decrease creating tapered instead of vertical sidewalls. Such a process would cause a stop etch, which would limit the depth of the etch.

Example of a Single Step Deposition Etch Phase

In an example of a preferred embodiment of the invention, the substrate 210 is a silicon wafer and the dielectric etch layer 220 is OSG (organosilicate glass) or Coral. In the preferred embodiment, the barrier layer is of SiC. The mask is formed (step 104) using a ArF (193 nmPR) photoresist. In the preferred embodiment, the ARC layer is a bottom antireflective coating (BARC). The substrate 210 is placed in a plasma processing chamber.

Figure 4:
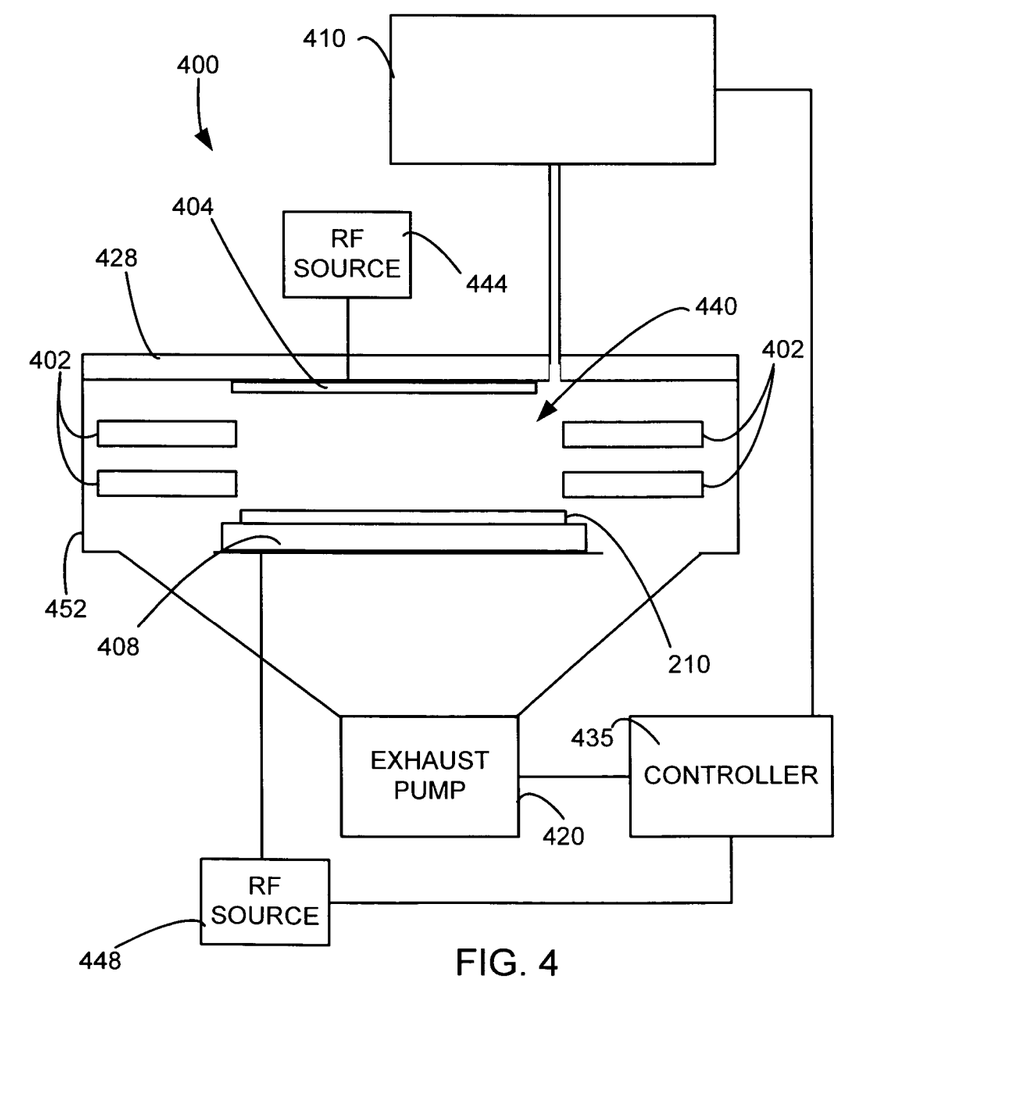
FIG. 4 is a schematic view of a plasma processing chamber that may be used for etching and stripping.

FIG. 4 is a schematic view of a plasma processing chamber 400 that may be used for etching and stripping. The plasma processing chamber 400 comprises confinement rings 402, an upper electrode 404, a lower electrode 408, a gas source 410, and an exhaust pump 420. The gas source 410 may comprise an etch gas source, a deposition gas source, and an cleaning phase gas source. Within plasma processing chamber 400, the substrate 210 is positioned upon the lower electrode 408. The lower electrode 408 incorporates a suitable substrate chucking mechanism (e.g., electrostatic, mechanical clamping, or the like) for holding the substrate 210. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source, a 60 MHz power source, and a 2 MHz power source. Different combinations of connecting RF power to the electrode are possible. In a preferred embodiment of the invention, the 27 MHz, 60 MHz, and 2 MHz power sources make up the second RF power source 448 connected to the lower electrode, and the upper electrode is grounded. A controller 435 is controllably connected to the RF sources 444, 448, exhaust pump 420, and the gas source 410. Such a device is capable of modulating the pressure of the chamber, gas flow, gas combinations, RF power, and time duration for each phase.

Figure 5A:
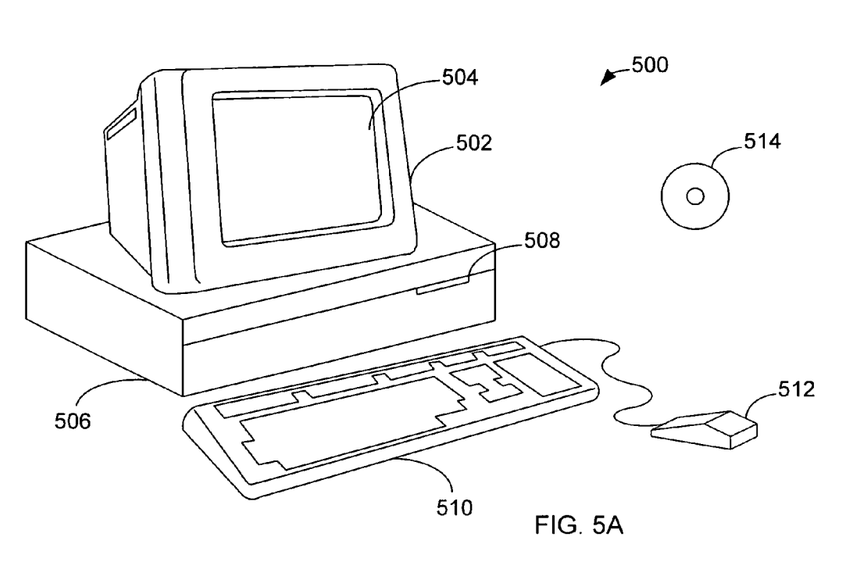
FIGS. 5A-B illustrate a computer system, which is suitable for implementing a controller used in embodiments of the present invention.
Figure 5B:
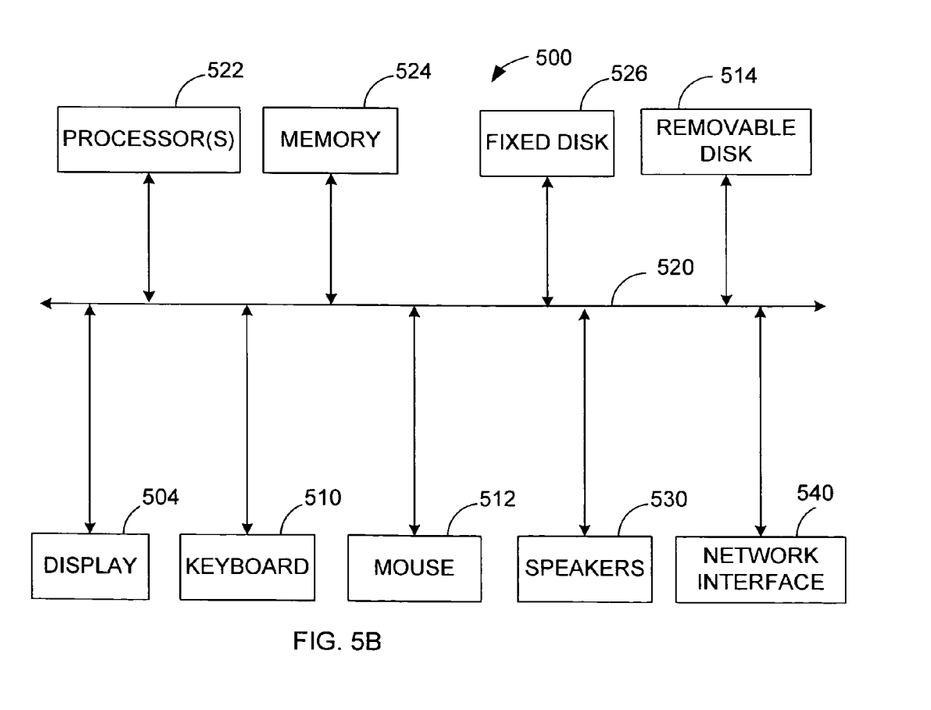

FIGS. 5A and 5B illustrate a computer system 500, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for computer system 500. Attached to system bus 520 are a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of the computer-readable media described below.

CPU 522 is also coupled to a variety of input/output devices, such as display 504, keyboard 510, mouse 512, and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Features are selectively etched into the etch layer 220 (step 108). The selective etch comprises a plurality of cycles, where each cycle comprises a deposition etch phase (step 112) and a polymer clean phase (step 116).

An example recipe for a deposition etch phase (step 112) is as follows: A deposition etch phase gas of 40 sccm of $CF_4$ and 90 sccm of $H_2$ is provided. The chamber pressure was set to 90 mTorr. 1200 W were provided by the 27 MHz RF source and 400 W were provided by the 2 MHz power source. In this example, the deposition etch is simultaneously done as a single step.

An example recipe for a polymer clean phase (step 116) is as follows: A polymer clean phase gas of 300 sccm of $O_2$ is provided. The chamber pressure was set to 250 mTorr. 100 W were provided by the 27 MHz RF source and no power was provided by the 2 MHz power source.

The trench mask is then stripped (step 120). An example of a mask strip provides strip gas of 10~3000 sccm of $O_2$. The chamber pressure was set to 5~500 mTorr. 100~1000 W were provided by the 2 MHz, 27 MHz RF source or combination of both 2 MHz and 27 MHz RF power source.

Example of a Two Step Deposition Etch Phase

Figure 3:
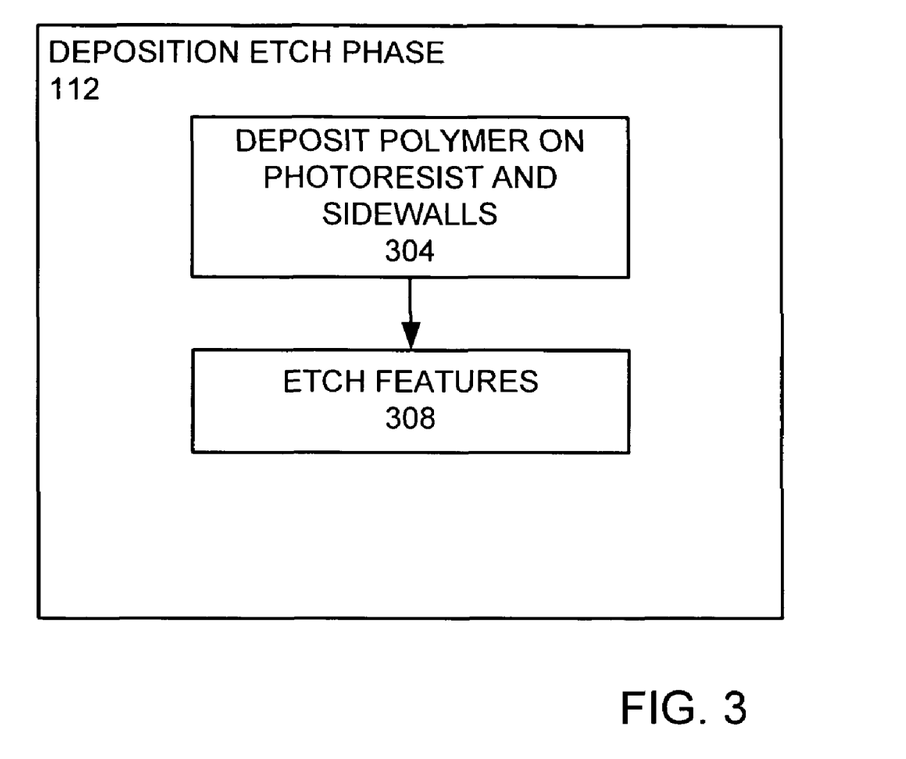
FIG. 3 is a more detailed flow chart of a two step deposition etch phase.

In another example that uses a two step deposition etch phase, a first step is used to deposit polymer and a second step is used to etch the etch layer. The same substrate and etch layer may be used as in the previous example. A mask is formed over the etch layer (step 104). Features are selectively etched into the etch layer 220 (step 108). FIG. 3 is a more detailed flow chart of the deposition etch phase (step 112) in this example. In this example, each deposition etch phase comprises a sequential deposit polymer on photoresist and sidewalls step (step 304) and then an etch features step (step 308). In one embodiment, a single deposit polymer step (step 304) and then a single etch features step (step 308) is performed for each deposition etch phase (step 112). In another embodiment, a cyclical process of a single deposit polymer step (step 304) and then a single etch features step (step 308) is repeated a plurality of times for each deposition etch phase (step 112).

An example recipe for a deposit polymer on photoresist and sidewalls step (step 304) is as follows: A deposit polymer gas of 50 sccm of $CH_3F$ and 250 sccm of Ar is provided. The chamber pressure was set to 40 mTorr. 500 W were provided by the 27 MHz RF source and 200 W were provided by the 2 MHz power source to generate a plasma from the deposit polymer gas.

An example recipe for an etch features step (step 308) is as follows: An etch gas of 25 sccm of $C_4F_6$, 24 sccm $O_2$, and 200 sccm of Ar is provided. The chamber pressure was set to 40 mTorr. 1200 W were provided by the 27 MHz RF source and 1200 W were provided by the 2 MHz power source to generate a plasma from the etch gas.

An example recipe for a polymer clean phase (step 116) is as follows: A polymer clean phase gas of 25 sccm of $C_4F_6$, 35 sccm $O_2$, and 200 sccm of Ar is provided. The chamber pressure was set to 35 mTorr. 1200 W were provided by the 27 MHz RF source and 1200 W were provided by the 2 MHz power source to generate a plasma from the polymer clean phase gas.

The mask is then stripped (step 120). The recipe in the above example may be used to strip the mask.

In these examples, the plasma processing chamber should be capable of modulating pressure of the chamber, gas flow, gas combinations, RF power, and time duration for each phase.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching features into an etch layer disposed below a photoresist mask without an intermediate hardmask, comprising:
providing a plurality of etch cycles, wherein each etch cycle comprises:
providing a deposition etch phase that etches features into the etch layer and deposits polymer on sidewalls of the features and over the photoresist, wherein the deposition etch phase comprises a single step which simultaneously etches the etch layer and deposits polymer on sidewalls of the features, wherein the deposition etch phase includes providing a gas including $CF_4$ and $H_2$; and
providing a cleaning phase that removes polymer deposited on the sidewalls;
wherein, immediately after the plurality of etch cycles, the etch features have bottoms and sidewalls that from bottom to top make an angle between 88° to 90° with the bottom of the features, wherein the providing a plurality of cycles comprises providing 10 to 100 cycles.

2. A method for etching features into an etch layer disposed below a photoresist mask without an intermediate hardmask, comprising:
providing a plurality of etch cycles, wherein each etch cycle comprises:
providing a deposition etch phase that etches features into the etch layer and deposits polymer on sidewalls of the features and over the photoresist, wherein the deposition etch phase comprises a single step which simultaneously etches the etch layer and deposits polymer on sidewalls of the features, wherein the deposition etch phase includes providing a gas including $CF_4$ and $H_2$; and
providing a cleaning phase that removes polymer deposited on the sidewalls;
wherein, immediately after the plurality of etch cycles, the etch features have bottoms and sidewalls that from bottom to top make an angle between 88° to 90° with the bottom of the features, wherein the providing a plurality of cycles comprises providing 15 to 50 cycles.

3. The method, as recited in claim 2, wherein deposition etch phase selectively etches the etch layer with respect to the photoresist mask.

4. The method, as recited in claim 3, wherein the cleaning phase selectively removes polymer deposited on the sidewalls with respect to the etch layer.

5. The method, as recited in claim 4, wherein the deposition etch phase does not remove the photoresist mask, providing an infinite selectivity.

6. A method for etching features into an etch layer disposed below a photoresist mask without an intermediate hardmask, comprising:
providing 15 to 50 etch cycles, which with infinite selectively etch the etch layer with respect to the photoresist mask, wherein each etch cycle comprises:
providing a deposition etch phase that etches features into the etch layer and deposits polymer on sidewalls of the features and over the photoresist, wherein the deposition etch phase comprises a single step which simultaneously etches the etch layer and deposits polymer on sidewalls of the features; and
providing a cleaning phase that removes polymer deposited on the sidewalls;
wherein, immediately after the plurality of etch cycles, the etch features have bottoms and sidewalls that from bottom to top make an angle between 88° to 90° with the bottom of the features.

7. The method, as recited in claim 6, wherein the providing a deposition etch phase, comprises:
providing an etch gas;
generating a plasma from the etch gas;
providing a deposition gas;
generating a plasma from the deposition gas; and
stopping the deposition etch phase, and wherein the providing a cleaning phase comprises:
providing a cleaning phase gas;
generating a plasma from the cleaning phase gas; and
stopping the cleaning phase.

8. The method of claim 6, wherein the deposition etch phase includes providing a gas including $CF_4$ and $H_2$, wherein the providing includes providing approximately 40 sccm of $CF_4$ and approximately 90 sccm of $H_2$.

9. The method, as recited in claim 6, wherein the deposition etch phase includes providing a gas consisting essentially of $CF_4$ and $H_2$.

10. A method for etching features into an etch layer disposed below a photoresist mask without an intermediate hardmask, comprising:
providing a plurality of etch cycles, wherein each etch cycle comprises:
providing a deposition etch phase that etches features into the etch layer and deposits polymer on sidewalls of the features and over the photoresist, wherein the deposition etch phase comprises a single step which simultaneously etches the etch layer and deposits polymer on sidewalls of the features, wherein the deposition etch phase includes providing a gas including $CF_4$ and $H_2$; and
providing a cleaning phase that removes polymer deposited on the sidewalls;
wherein, immediately after the plurality of etch cycles, the etch features have bottoms and sidewalls that from bottom to top make an angle between 88° to 90° with the bottom of the features, wherein the providing a gas including $CF_4$ and $H_2$, comprises providing approximately 40 sccm of $CF_4$ and approximately 90 sccm of $H_2$.

* * * * *